(12) United States Patent
Sakui

(10) Patent No.: US 8,942,045 B2
(45) Date of Patent: Jan. 27, 2015

(54) MEMORY APPARATUS AND METHODS

(71) Applicant: Micron Technology, Inc., Boise, ID (US)

(72) Inventor: Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/136,819

(22) Filed: Dec. 20, 2013

(65) Prior Publication Data

US 2014/0104959 A1    Apr. 17, 2014

Related U.S. Application Data

(63) Continuation of application No. 13/099,180, filed on May 2, 2011, now Pat. No. 8,614,918.

(51) Int. Cl.
| | |
|---|---|
| G11C 16/24 | (2006.01) |
| G11C 16/04 | (2006.01) |
| G11C 16/10 | (2006.01) |
| G11C 16/26 | (2006.01) |

(52) U.S. Cl.
CPC ............ *G11C 16/04* (2013.01); *G11C 16/0483* (2013.01); *G11C 16/10* (2013.01); *G11C 16/26* (2013.01)
USPC ............ 365/185.18; 365/185.17; 365/185.21; 365/185.25

(58) Field of Classification Search
CPC ........................................................ G11C 16/26
USPC .................................................... 365/185.18
See application file for complete search history.

(56) References Cited

U.S. PATENT DOCUMENTS

| | | | |
|---|---|---|---|
| 5,043,942 A | 8/1991 | Iwata et al. | |
| 5,606,527 A | 2/1997 | Kwack et al. | |
| 5,661,682 A | 8/1997 | Lim et al. | |
| 6,031,760 A | 2/2000 | Sakui | |
| 6,549,461 B2 * | 4/2003 | Park et al. | ................ 365/185.17 |
| 6,717,222 B2 | 4/2004 | Zhang | |
| 6,804,150 B2 | 10/2004 | Park et al. | |
| 6,826,082 B2 | 11/2004 | Hwang et al. | |
| 7,035,143 B2 | 4/2006 | Lee | |
| 7,177,191 B2 | 2/2007 | Fasoli et al. | |
| 7,233,024 B2 | 6/2007 | Scheuerlein et al. | |
| 7,272,050 B2 | 9/2007 | Han et al. | |
| 7,511,996 B2 | 3/2009 | Kim | |
| 7,518,920 B2 | 4/2009 | Kang | |
| 7,672,167 B2 | 3/2010 | Sung et al. | |
| 7,706,188 B2 | 4/2010 | Kim | |
| 7,760,579 B2 | 7/2010 | Kang | |
| 8,614,918 B2 | 12/2013 | Sakui | |
| 2008/0186776 A1 | 8/2008 | Kim et al. | |
| 2010/0259961 A1 | 10/2010 | Fasoli et al. | |
| 2012/0281476 A1 | 11/2012 | Sakui | |

* cited by examiner

*Primary Examiner* — Son Mai
(74) *Attorney, Agent, or Firm* — Schwegman Lundberg & Woessner, P.A.

(57) ABSTRACT

Embodiments of apparatus and methods having a memory device can include a line to exchange information with a string of memory cells and a transistor coupled between the string of memory cells and the line. Such a memory device can also include a module configured to couple a gate of the transistor to a node during a first time interval of a memory operation and decouple the gate from the node during a second time interval of the memory operation. Additional apparatus and methods are described.

24 Claims, 7 Drawing Sheets

MEMORY APPARATUS AND METHODS

PRIORITY APPLICATION

This application is a continuation of U.S. application Ser. No. 13/099,180, filed May 2, 2011, which is incorporated herein by reference in its entirety.

BACKGROUND

Non-volatile memory devices, such as flash memory, are widely used in computers and many electronic products. Such memory devices have numerous memory cells. Information can be stored into the memory cells in a programming operation. The stored information can be retrieved in a read operation or can be cleared in an erase operation. As memory cell density increases for a given device area, controlling operations in these devices may pose a challenge.

DETAILED DESCRIPTION

Figure 1:
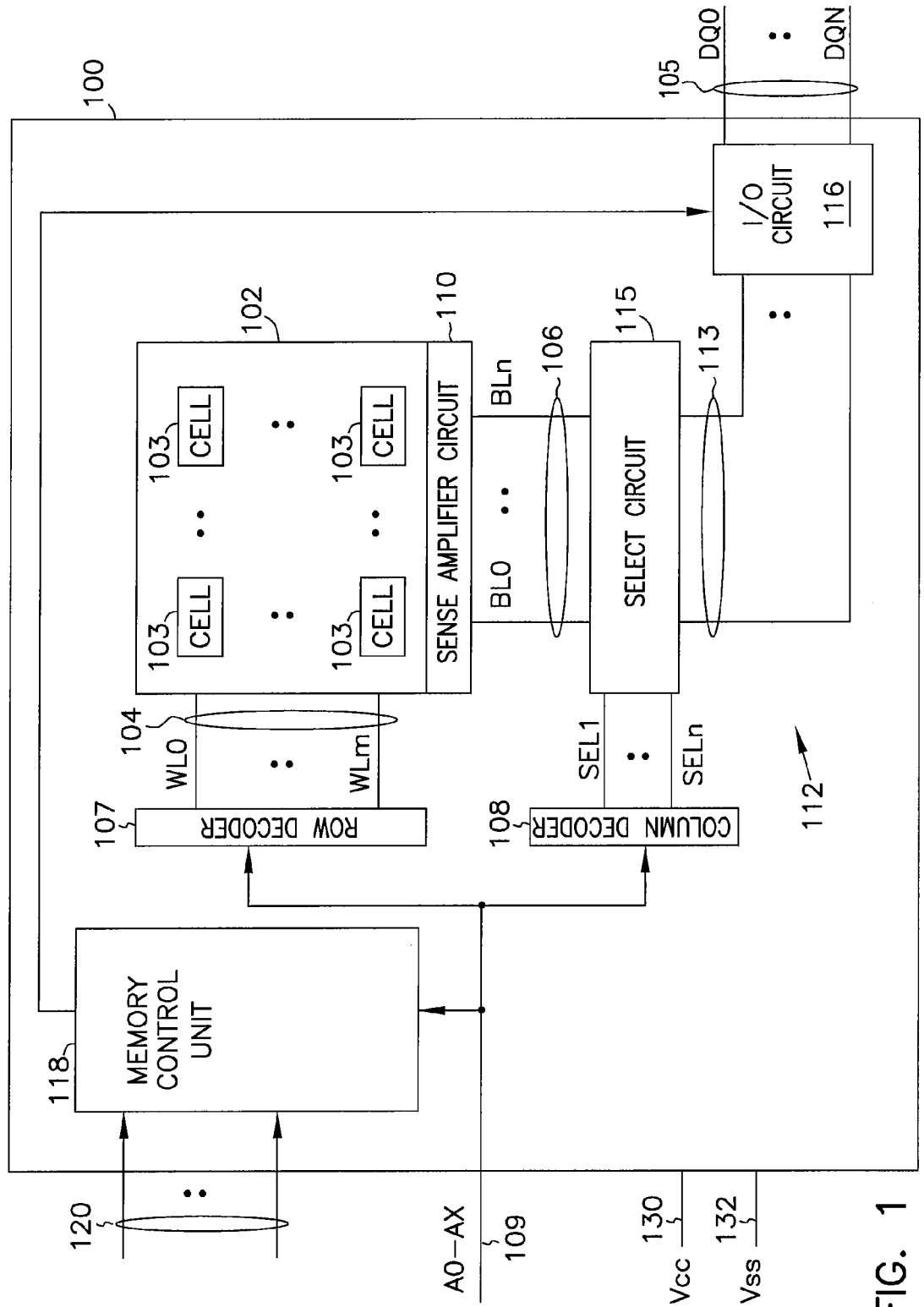
FIG. 1 shows a block diagram of a memory device having a memory array, according to an embodiment of the invention.

FIG. 1 shows a block diagram of a memory device 100 having a memory array 102 with memory cells 103, according to an embodiment of the invention. Memory cells 110 can be arranged in rows and columns along with lines 104 and lines 106. Lines 104 can carry signals WL0 through WLm. Lines 106 can carry BL0 through BLn. Lines 104 can be part of access (e.g., word) lines of memory device 100. Lines 106 can be part of data (e.g., bit) lines of memory device 100.

Memory device 100 may use lines 104 to access memory cells 103 and lines 106 to exchange information with memory cells 103. A row decoder 107 and a column decoder 108 decode address signals A0 through AX on lines 109 (e.g., address lines) to determine which memory cells 103 are to be accessed.

A sense amplifier circuit 110 operates to determine the value of information sensed (e.g., read) from memory cells 103 and provides the information in the form of signals to lines 106. Sense amplifier circuit 110 can also use the signals on lines 106 to determine the value of information to be written (e.g., programmed) into memory cells 103.

Memory device 100 includes circuitry 112 to transfer information between memory array 102 and lines (e.g., DQ lines) 105. Signals DQ0 through DQN on lines 105 can represent information read from or written into memory cells 103. Lines 105 can include nodes within memory device 100 or pins (or solder balls) on a package where memory device 100 can reside. Other devices external to memory device 100 (e.g., a memory controller or a processor) can communicate with memory device 100 through lines 105, 109, and 120.

Memory device 100 can perform memory operations such as a read operation to read information from memory cells 103 and a programming operation (sometime referred to as write operation) to program (e.g., write) information into memory cells 103. Memory device 100 can also perform a memory erase operation to clear information from some or all of memory cells 103. A memory control unit 118 controls the memory operations based on control signals on lines 120. Examples of the control signals on lines 120 can include one or more clock signals and other signals to indicate which operation (e.g., a programming or read operation) memory device 100 can perform. Other devices external to memory device 100 (e.g., a processor or a memory controller) can control the values of the control signals on lines 120. Specific values of a combination of the signals on lines 120 can produce a command (e.g., programming, read, or erase command) that can cause memory device 100 to perform a corresponding memory operation (e.g., programming, read, or erase operation).

Each of memory cells 103 can be programmed to store information representing a value of a partial bit, single bit or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value representing multiple bits, such as one of four possible values "00", "01", "10", and "11" of two bits, one of eight possible values "000", "001", "010", "011", "100", "101", "110" and "111" of three bits, or one of other values of another number of multiple bits. A cell that has the ability to store multiple bits is sometimes called a multi-level cell (or multi-state cell).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Circuitry 112 of memory device 100 can include a select circuit 115 and an input/output (I/O) circuit 116. Select circuit 115 can respond to signals SEL1 through SELn to select the signals on lines 106 and 113 that can represent the information read from or programmed into memory cells 103. Column decoder 108 can selectively activate the SEL1 through SELn signals based on the A0 through AX address signals on lines 109. Select circuit 115 can select the signals on lines 106 and 113 to provide communication between memory array 102 and input/output (I/O) circuit 116 during read and programming operations.

Memory device 100 can include a non-volatile memory device and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or other kinds of memory devices.

Memory device 100 can include a memory device (e.g., a planar memory device) where memory cells 103 can be physically located in only a single device level. Memory device 100 can also include a three dimensional (3-D) memory device where memory cells 103 can physically located in multiple device levels, such that some of memory cells 103 can be stacked over some other memory cells 103 in multiple device levels over a substrate (e.g., a semiconductor substrate).

One of ordinary skill in the art may recognize that memory device 100 may include other elements, several of which are not shown in the figure, so as not to obscure the embodiments described herein.

Memory device 100 may include devices, memory cells, and operate using memory operations (e.g., read and write operations) similar to or identical to those described below with reference to FIG. 2 through FIG. 8.

Figure 2:
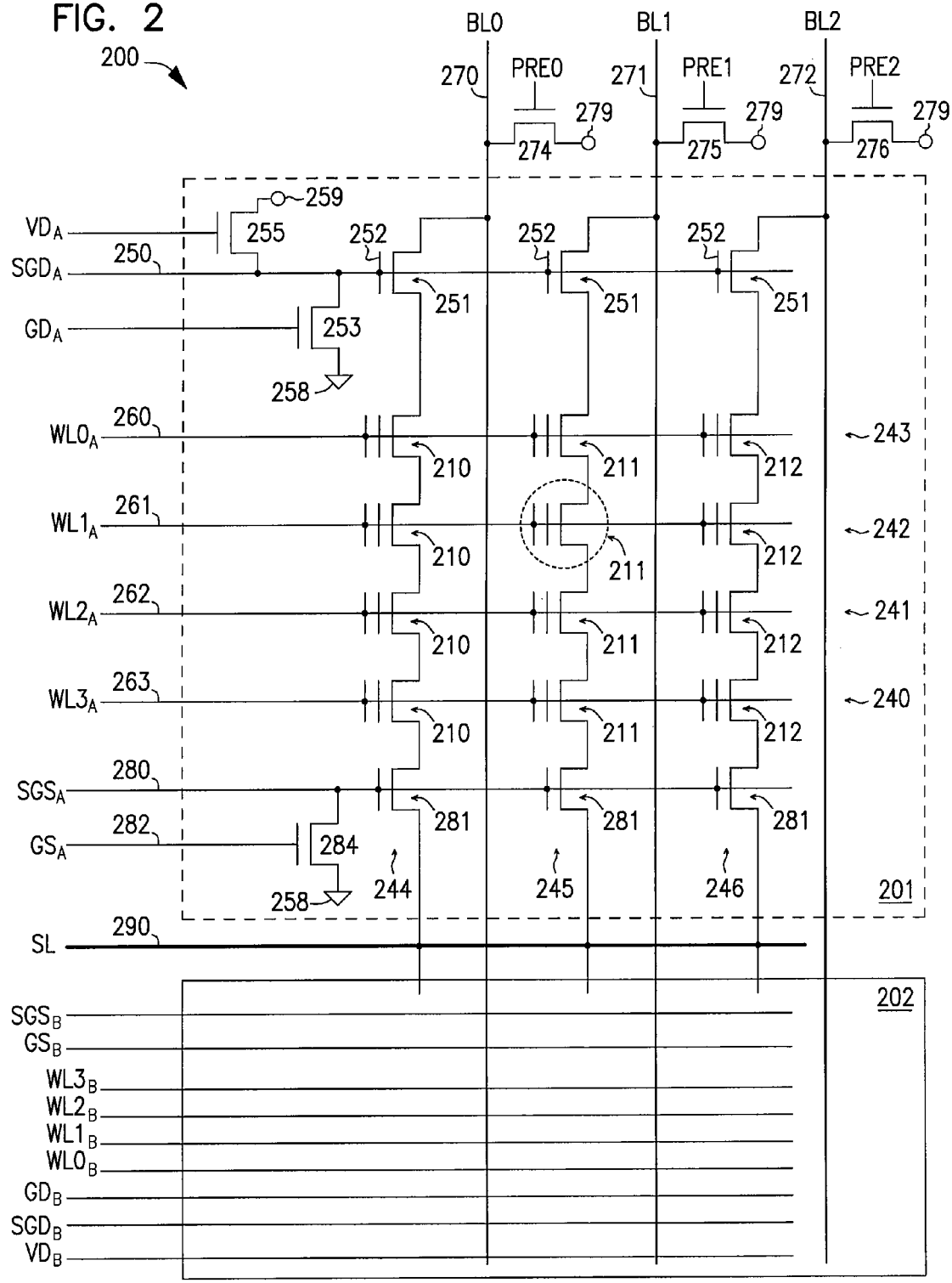
FIG. 2 shows a schematic diagram of a portion of a memory device including a group of memory cells, according to an embodiment of the invention.

FIG. 2 shows a schematic diagram of a portion of a memory device 200 including details of memory cells in a group 201, according to an embodiment of the invention. Memory device 200 can be associated with memory device 100 of FIG. 1, such as forming a portion of memory array 102 of memory device 100. In FIG. 2, memory device 200 includes memory cells 210, 211, and 212, arranged in rows 240, 241, 242, and 243, and columns 244, 245, and 246. FIG. 2 shows an example of four rows and three columns with four memory cells in each column. The number of rows, columns, and memory cells may vary.

Memory cells 210, 211, and 212 can be arranged in groups, such as groups 201 and 202. Each of groups 201 and 202 can correspond to a block of memory cells. FIG. 2 shows details of only group 201. Group 202 can also include memory cells and elements similar to those shown in group 201. FIG. 2 shows an example of two groups of memory cells. The number of groups may vary.

Memory device 200 can include lines 260, 261, 262, and 263, which can be part of word lines of memory device 200 that can carry signals $WL0_A$, $WL1_A$, $WL2_A$, and $WL3_A$. As shown in FIG. 2, memory cells 210, 211, and 212 in the same row can share the same line 260, 261, 262, or 263. Memory device 200 uses lines 260, 261, 262, and 263 to control access to memory cells 210, 211, and 212 during a read operation to sense (e.g., read) information stored in memory cells 210, 211, and 212, and during a programming operation to store information into memory cells 210, 211, and 212.

Memory device 200 can include lines 270, 271, and 272, which can be part of data lines of memory device 200 that can carry signals BL0, BL1, and BL2, respectively. The data lines are sometimes considered bit lines of memory device 200. The data lines can correspond to DQ lines of memory device 200. Memory device 200 can use lines 270, 271, and 272 to exchange information with memory cells 210, 211, and 212, respectively. For example, during a read operation, memory device 200 can use lines 270, 271, and 272 to transfer information sensed from memory cells 210, 211, and 212.

Memory device 200 can include transistors 251, each coupled between one of lines 270, 271, and 272 and a corresponding string of memory cells (wherein a string or strings that can be coupled to a same data line can form a column). A gate 252 of each of transistors 251 can form part of a control line 250, which can carry a signal $SGD_A$. As shown in FIG. 2, memory cells 210 (in column 244), memory cells 211 (in column 245), and memory cells 212 (in column 246) are associated with line 270, 271, and 272, respectively. Each of transistors 251 can couple (e.g., when it turns on) the memory cells in a corresponding string to an associated line 270, 271, or 272. Each of transistors 251 can decouple (e.g., when it turns off) the memory cells in the same string from an associated line 270, 271, or 272. Memory device 200 may use signal $SGD_A$ on line 250 to turn on and turn off transistors 251. For example, each of transistors 251 may turn on when signal $SGD_A$ has one level (e.g., high) and turn off when signal $SGD_A$ has another level (e.g., low).

Memory device 200 can include a transistor 253 coupled between a node 258 and line 250 and gate 252 of each of transistors 251. Node 258 can be coupled to a reference potential, such as Vss. For example, node 258 can include a ground node or can be coupled to the ground node of memory device 200. Thus, node 258 can have a voltage equal to approximately zero volts. Transistor 253 can couple (e.g., when it turns on) line 250 and gate 252 of each of transistors 251 to node 258. Transistor 253 can decouple (e.g., when it turns off) line 250 and gate 252 of each of transistors 251 from node 258. Memory device 200 may use a signal $GD_A$ to turn on or turn off transistor 253. For example, transistor 253 may turn on when signal $GD_A$ has one level (e.g., high) and turn off when signal $GD_A$ has another level (e.g., low).

Memory device 200 can include a transistor 255 coupled between a node 259 and line 250 and gate 252 of each of transistors 251. Node 259 can include a voltage having positive value (e.g., Vcc). Transistor 255 can couple (e.g., when it turns on) line 250 and gate 252 of each of transistors 251 to node 259. Transistor 255 can decouple (e.g., when it turns off) line 250 and gate 252 of each of transistors 251 from node 259. Memory device 200 may use a signal $VD_A$ to turn on or turn off transistor 255. For example, transistor 255 may turn on when signal $VD_A$ has one level (e.g., high) and turn off when signal $VD_A$ has another level (e.g., low).

Memory device 200 can include transistors 274, 275, and 276, each coupled between a node 279 and one of lines 270, 271, and 272. Node 279 can have a voltage with a positive value (e.g., Vcc) that can be a supply voltage of memory device 200. Transistors 274, 275, and 276 can be controlled by a corresponding signal PRE0, PRE1, or PRE2 to selectively couple and decouple a corresponding line 270, 271, or 272 to and from node 279. For example, each of transistors 274, 275, and 276 can couple (e.g., when it turns on) a corresponding line 270, 271, or 272 to node 279 when the corresponding signal PRE0, PRE1, or PRE2 has one level (e.g., high). Each of transistors 274, 275, and 276 can decouple (e.g., when it turns off) the corresponding line 270, 271, or 272 from node 279 when the corresponding signal PRE0, PRE1, or PRE2 has another level (e.g., low).

Memory device 200 can include transistors 281, each coupled between line 290 and memory cells 210, 211, and 212 in a corresponding string. Line 290 can form part of a source line of memory device 200. Line 290 can be coupled to a reference potential (e.g., Vss). Each of transistors 281 can couple (e.g., when it turns on) the memory cells in a corresponding string to line 290. Each of transistors 281 can decouple (e.g., when it turns off) the memory cells in the same string from line 290. Gates of transistors 281 are coupled to a line 280, which can carry signal $SGS_A$. Memory device 200 may turn on or turn off transistors 281 based on the levels of signal $SGS_A$. For example, transistors 281 may turn on when signal $SGS_A$ has one level (e.g., high) and turn off when signal $SGS_A$ has another level (e.g., low).

Memory device 200 can include a transistor 284 coupled between line 280 and node 258. Transistor 284 can couple (e.g., when it turns on) line 280 to node 258. Transistor 284 can decouple (e.g., when it turns off) line 280 from node 258. Memory device 200 may use a signal $GS_A$ to turn on or turn off transistor 284. For example, transistor 284 may turn on when signal $GS_A$ has one level (e.g., high) and turn off when signal $GS_A$ has another level (e.g., low).

Figure 5:
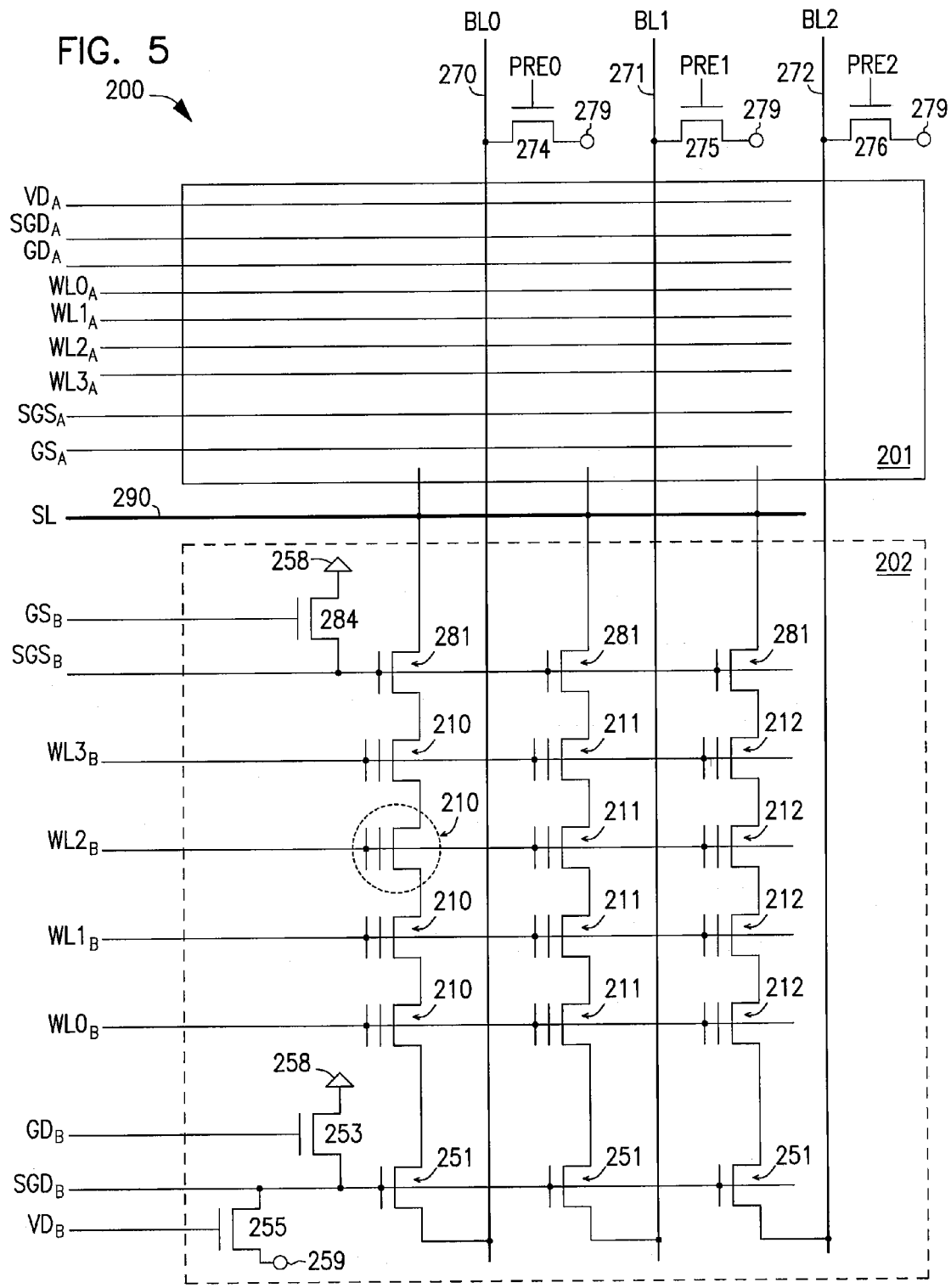
FIG. 5 shows a schematic diagram of the memory device of FIG. 2 including another group of memory cells, according to an embodiment of the invention.

Signals $SGS_B$, $GS_B$, $WL0_B$, $WL1_B$, $WL2_B$, $WL3_B$, $GD_B$, $SGD_B$, and $VD_B$ in group 202 can be coupled to elements, such as memory cells and transistors, in a fashion similar to that of signals $SGS_A$, $GS_A$, $WL0_A$, $WL1_A$, $WL2_A$, $WL3_A$, $GD_A$, $SGD_A$, $GS_A$, and $VD_A$, respectively. Details of the connections of the signals associated with group 202 are shown in FIG. 5.

FIG. 2 shows an example where memory cell 211 (in the dashed circle) in row 242 and column 245 in group 201 is selected to be accessed during a memory operation, such as a read operation. Other memory cells 210, 211, and 212 in group 201 are unselected memory cells. All memory cells in group 202 are also assumed to be unselected memory cells in the example associated with FIG. 2. FIG. 2 shows an example of only one memory cell in a row (e.g., 211 in row 242) is selected. Multiple memory cells in the same row can be selected in a memory operation. For example, two or more of memory cells 210, 211, and 212 in row 242 can be selected memory cells and all memory cells in group 202 can be unselected memory cells.

In the description herein, a selected memory cell refers to the memory cell that is selected to be accessed in a memory operation (e.g., a read operation), so that memory device 200 can sense information stored in the selected memory cell or program information into the selected memory cell. An unselected memory cell refers to the memory cell that is not selected to be accessed during a memory operation (e.g., a read operation).

Figure 3:
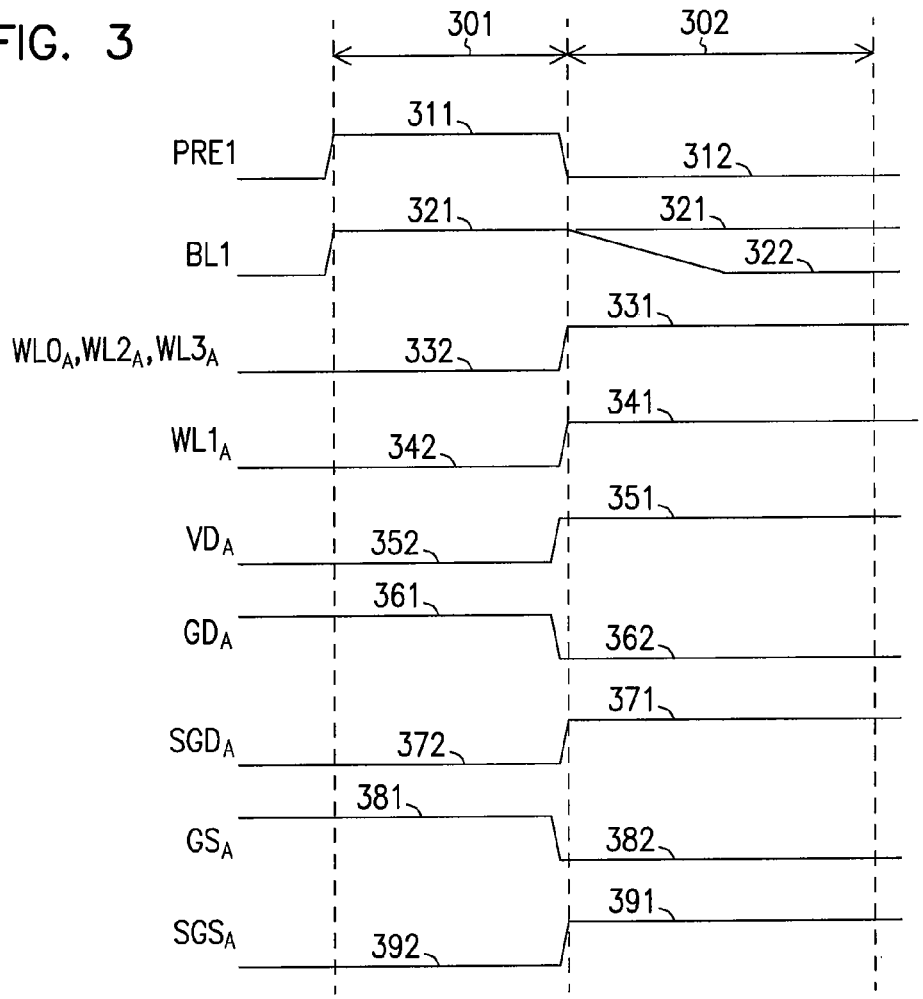
FIG. 3 is an example timing diagram for some signals associated with a selected memory cell during a memory operation of the memory device of FIG. 2, according to an embodiment of the invention.

FIG. 3 is an example timing diagram for some signals associated with selected memory cell 211 during a memory operation of memory device 200 of FIG. 2, according to an embodiment of the invention. In FIG. 3, time intervals 301 and 302 can correspond to a charge time interval (e.g., precharge time interval) and a sensing time interval, respectively, during a read operation to sense and retrieve information stored in selected memory cell 211. The following description refers to both FIG. 2 and FIG. 3.

As shown in FIG. 3, time interval 301 can occur when signal PRE1 has a level 311. Time interval 302 can occur when signal PRE1 has a level 312. Transistor 275 may turn on or turn off based on levels 311 and 312. Level 311 can have a voltage having a positive value, such as Vcc or other values that can cause transistor 275 to turn on. Level 312 can include a reference potential, such as ground. Transistor 275 turns on when signal PRE1 has level 311 (e.g., during time interval 301). When it turns on, transistor 275 couples line 271 to node 279, which can have a voltage (e.g., Vcc) corresponding to a supply voltage of memory device 200. When line 271 is coupled to node 279 (e.g., during time interval 301), signal BL1 on line 271 can have level 321, which can correspond to the level (e.g., value) of the voltage at node 279. Transistor 275 turns off when signal PRE1 has level 312 (e.g., during time interval 302). Line 271 is decoupled from node 279 when transistor 275 turns off. When line 271 is decoupled from node 279 (e.g., during time interval 302), signal BL1 on line 271 can either remain at level 321 or decrease to level 322 (e.g., ground potential), depending on the value of information stored in selected memory cell 211 (as explained below with reference to signal $WL1_A$). Based on the level (e.g., either 321 or 322) of signal BL1 during time interval 302, memory device 200 can determine the value of information stored in selected memory cell 211.

During time interval 301, signals $WL0_A$, $WL2_A$, and $WL3_A$ can have a level 332 (e.g., ground potential). During time interval 302, signals $WL0_A$, $WL2_A$, and $WL3_A$ have a level 331, which can include a sufficient voltage to turn on transistors in other memory cells 211 (in rows 240, 241, and 243) and enable them to operate as pass elements to form a portion of a conductive path between line 271 and line 290.

During time interval 301, signal $WL1_A$ can have a level 342, which can be the same as level 332 of signals $WL0_A$, $WL2_A$, and $WL3_A$. During time interval 302, signal $WL1_A$ can have a level 341, which can include an appropriate voltage to enable a transistor in selected memory cell 211 to turn on or turn off, depending on the value (e.g., threshold voltage value) of information stored in selected memory cell 211. If the transistor in selected memory cell 211 turns on during time interval 302 (e.g., when the threshold voltage value of selected memory cell is less than level 341 of signal $WL1_A$), line 271 may discharge to line 290 through a conductive path formed between lines 271 and 290 by transistors in memory cells 211 during time interval 302. In this case, signal BL1 on line 271 may have level 322 because line 271 may discharge to line 290. If the transistor in selected memory cell 211 does not turn on (e.g., when the threshold voltage value of selected memory cell is greater than level 341 of signal $WL1_A$) during time interval 302, line 271 may not discharge to line 290 because a conductive path may not be formed between lines 271 and 290 by transistors in memory cells 211 during time interval 302. Thus, in this case, signal BL1 on line 271 may remain at level 321 during time interval 302.

FIG. 3 also shows signal $VD_A$ having levels 351 and 352. Transistor 255 may turn on or turn off based on levels 351 and 352. Level 351 can have a voltage having a positive value, such as Vcc or other values that can cause transistor 255 to turn on. Level 352 can include a ground potential. Transistor 255 turns off when signal $VD_A$ has level 352 (e.g., during time interval 301). Transistor 255 turns on when signal $VD_A$ has level 351 (e.g., during time interval 302). When it turns on, transistor 255 couples line 250 and gates 252 of transistors 251 to node 259. When transistor 255 turns off, line 250 and gates 252 of transistors 251 are decoupled from node 259.

Signal $GD_A$ can have levels 361 and 362. Transistor 253 may turn on or turn off based on levels 361 and 362. Level 361 can have a voltage having a positive value, such as Vcc or other values that can cause transistor 253 to turn on. Level 362 can include a ground potential. Transistor 253 turns on when signal $GD_A$ has level 361 (e.g., during time interval 301). Transistor 253 turns off when signal $GD_A$ has level 362 (e.g., during time interval 302). When it turns on, transistor 253 couples line 250 and gates 252 of transistors 251 to node 258. When transistor 253 turns off, line 250 and gates 252 of transistors 251 are decoupled from node 258.

Signal $SGD_A$ can have levels 371 and 372 based on the states of transistors 253 and 255. For example, signal $SGD_A$ can have level 372 when transistor 253 turns on and transistor 255 turns off (e.g., during time interval 301). Signal $SGD_A$ can have level 371 when transistor 253 turns off and transistor 255 turns on (e.g., during time interval 302). Level 372 can include a ground potential. Level 371 can have a voltage having a positive value (e.g., value corresponding to a voltage value at node 259).

Signal $GS_A$ can have levels 381 and 382. Transistor 284 may turn on or turn off based on levels 381 and 382. Level 381 can have a voltage having a positive value, such as Vcc or other values that can cause transistor 284 to turn on. Level 382 can include a ground potential. Transistor 284 turns on when signal $GS_A$ has level 381 (e.g., during time interval 301). Transistor 284 turns off when signal $GS_A$ has level 382 (e.g., during time interval 302). When it turns on, transistor 284 couples line 280 to node 258. When transistor 284 turns off, line 280 is decoupled from node 258.

Signal $SGS_A$ can have levels 391 and 392 based on the states of transistor 284. For example, signal $SGS_A$ can have level 392 when transistor 284 turns on (e.g., during time interval 301). Signal $SGS_A$ can have level 391 when transistor 284 turns off (e.g., during time interval 302). Level 392 can include a ground potential. Level 391 can have a voltage having a positive value.

The above description describes an example when at least one of memory cell (e.g., selected memory cell 211) in group 201 is selected during a memory operation to sense information stored in the selected memory cell. The following description gives an example where none of memory cells 210, 211, and 212 in group 201 are selected memory cells during the memory operation.

Figure 4:
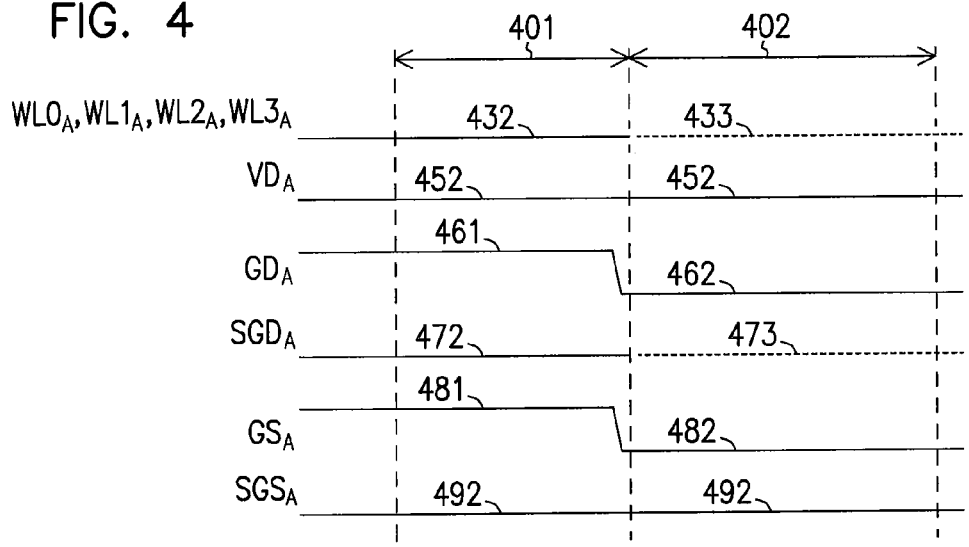
FIG. 4 is an example timing diagram for some signals associated with unselected memory cells during a memory operation of the memory device of FIG. 2, according to an embodiment of the invention.

FIG. 4 is an example timing diagram for some signals associated with unselected memory cells during a memory operation of memory device 200 of FIG. 2, according to an embodiment of the invention. In the example of FIG. 4, none of the memory cells in group 201 are selected memory cells. At least one memory cell in group 202 is a selected memory cell in the example of FIG. 4.

FIG. 4 shows time intervals 401 and 402, which can correspond to a charge time interval (e.g., precharge time interval) and a sensing time interval, respectively, during a read operation to sense (e.g., read) information stored in at least one selected memory cell in group 202. Time intervals 401 and 402 can be similar to time intervals 301 and 302 of FIG. 3.

In FIG. 4, signals $WL0_A$, $WL1_A$, $WL2_A$, and $WL3_A$ can have a level 432 during time interval 401 and a level 433 during time interval 402. Level 432 can correspond to levels 332 and 342 of FIG. 3. Level 432 can be zero volts. Level 433 can be less than level 432. For example, level 433 can be close to zero volts but less than zero volts. FIG. 4 shows level 433 as dashed line to indicate that, during time interval 402, lines 260, 261, 262, and 263 in FIG. 2 (associated with signals $WL0_A$, $WL1_A$, $WL2_A$, and $WL3_A$, respectively) may not be coupled to a node that has a specific voltage, such as a node having zero volts (e.g., ground potential) or a node having a specific positive voltage.

In FIG. 4, signal $VD_A$ can have a level 452 during time intervals 401 and 402. Level 452 can correspond to level 352 of FIG. 3. Level 452 can include a ground potential.

Signals $GD_A$ can have a level 461 during time interval 401 and a level 462 during time interval 402. Levels 461 and 462 can correspond to levels 361 and 362, respectively, of FIG. 3.

Signals $SGD_A$ can have a level 472 during time interval 401 and a level 473 during time interval 402. Level 472 can correspond to level 372 of FIG. 3. Level 472 can be zero volts. Level 473 can be less than level 472. For example, level 473 can be close to zero volts but less than zero volts. FIG. 4 shows level 473 as dashed line to indicate that, during time interval 402, line 250 and gates 252 of transistors 251 (FIG. 2) may not be coupled to a node that has a specific voltage, such as a node having zero volts (e.g., ground potential) or a node having a specific positive voltage. For example, as shown in time interval 402 in FIG. 4, signal $VD_A$ has level 452 and signal $GD_A$ has level 462. Both levels 452 and 462 can be at ground potential. Thus, during time interval 402, both transistors 253 and 255 can turn off. Therefore, during time interval 402, line 250 and gates 252 of transistors 251 can be decoupled from both of nodes 258 and 259. Leaving line 250 and gates 252 of transistors 251 decoupled from both of nodes 258 and 259 during time interval 402 may reduce coupling capacitance between line 250 and line 270.

Signals $GS_A$ in FIG. 4 can have a level 481 during time interval 401 and a level 482 during time interval 402. Levels 481 and 482 can correspond to levels 381 and 382, respectively, of FIG. 3.

Signals $SGS_A$ can have a level 492 during time intervals 401 and 402. Level 492 can correspond to level 392 of FIG. 3. Level 492 can include a ground potential.

FIG. 5 shows a schematic diagram of memory device of FIG. 2 including details of memory cells in group 202, according to an embodiment of the invention. In comparison with FIG. 2, details of group 201 are omitted. As shown in FIG. 5, group 202 includes memory cells 210, 211, 212, and transistors 251, 253, 255, 281, and 284 having a similar arrangement as the memory cells and transistors in group 201 in FIG. 2. FIG. 5 shows an example where memory cell 210 associated with signal $WL2_B$ is a selected memory cell in a memory operation, such as read operation.

Figure 6:
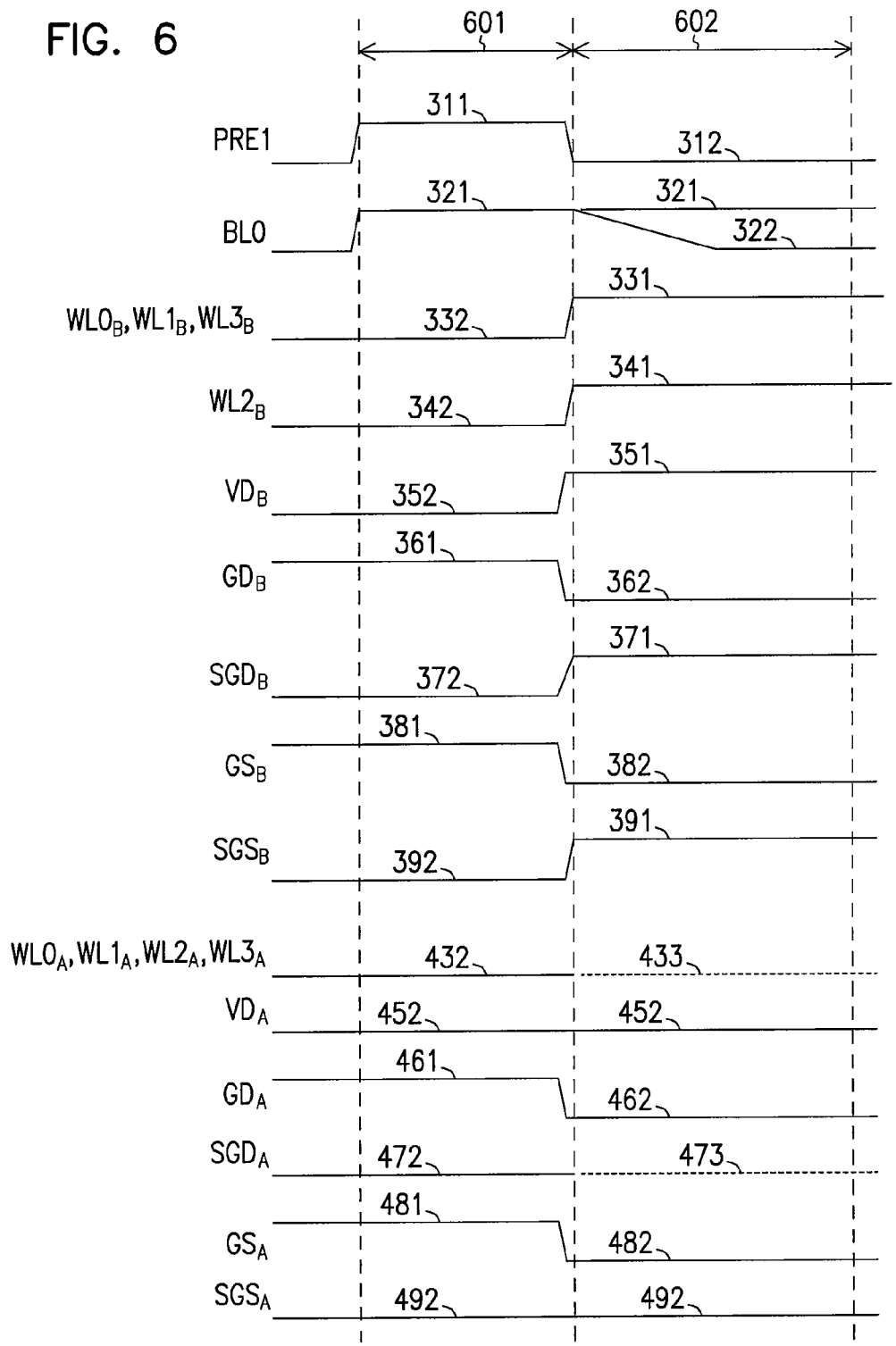
FIG. 6 is an example timing diagram for some signals associated with a selected memory cell and unselected memory cells during a memory operation of the memory device of FIG. 5, according to an embodiment of the invention.

FIG. 6 is an example timing diagram for some signals associated with selected memory cell 210 and unselected memory cells during a memory operation of memory device 200 of FIG. 5, according to an embodiment of the invention. In the example timing diagram of FIG. 6, none of the memory cells in group 201 are assumed to be selected memory cells. As shown in FIG. 6, the signals associated with group 202 can have levels similar to those of group 201 in FIG. 3, except for signals BL0 and $WL2_B$ in FIG. 6 because memory cell 210 associated with signals BL0 and $WL2_B$ is a selected memory cell. Signal BL0 has levels similar to those of signal BL1 of FIG. 3. Signal $WL2_B$ has levels similar to those of signal $WL1_A$ of FIG. 3.

In the example of FIG. 6, during time interval 601 (e.g., charge time interval), signal BL0 associated with selected memory cell 210 in group 202 can have signal level 321. During time interval 602 (e.g., sensing time interval), memory device 200 may sense the level of signal BL0 (which may have either level 321 or 322) to determine information stored in selected memory cell 210. The signals associated with the memory cells (which are unselected) in group 201 are similar to those in the example of FIG. 4, as described above with reference to FIG. 4. For example, signal $SGD_A$ has signal levels 472 and 473 during time intervals 601 and 602, respectively. FIG. 6 shows level 473 in dashed line to indicate that line 250 and the gates of transistors 251 are decoupled from both of nodes 258 and 259 during time interval 602.

Figure 7:
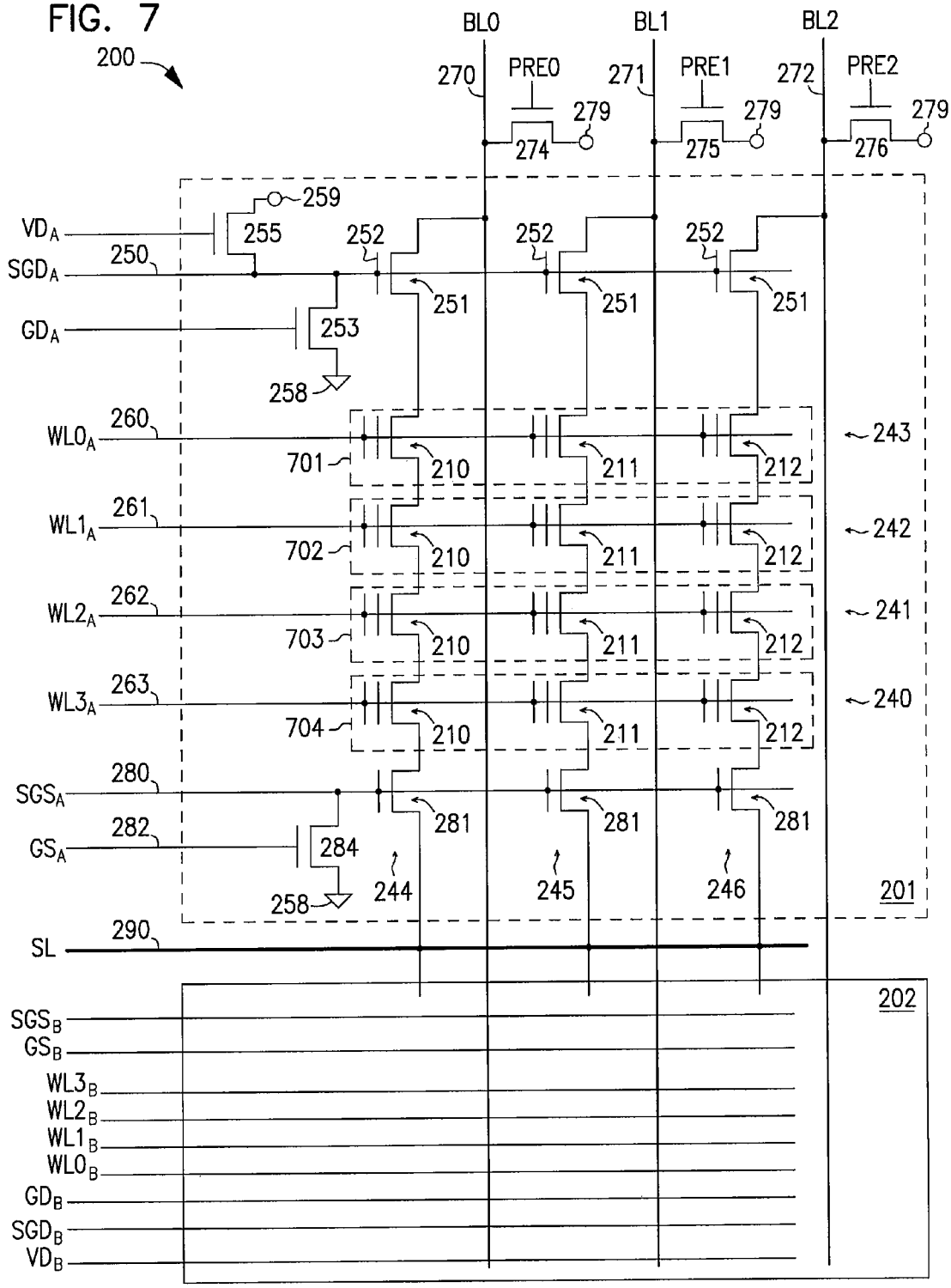
FIG. 7 shows a schematic diagram of a portion of the memory device of FIG. 2 including memory cells organized into pages, according to an embodiment of the invention.

FIG. 7 shows a schematic diagram of a portion of a memory device 200 of FIG. 2 including memory cells 210, 211, and 212 organized into pages 701, 702, 703, and 704, according to an embodiment of the invention. As shown in FIG. 7, each of pages 701, 702, 703, and 704 can include memory cells associated with the same line 260, 261, 262, or 263. For example, page 701 can include memory cells 210, 211, and 212 in row 243 and associated with the same line 260. Memory device 200 may store information in pages 701, 702, 703, and 704 in a non-sequential page order. For example, during a programming operation, memory device 200 may store information in page 702. In this example, the memory cells in pages 701, 703, and 704 may not contain stored information; they may remain in erased state, for example. In another programming operation, after the memory cells in page 702 contain stored information, memory device 200 may store additional information in page 704. Thus, after two programming operations, the memory cells in pages 702 and 704 contain stored information and the memory cells in pages 701 and 703 may remain in an erased state. Memory device 200 may continue to store information into the memory cells of the remaining pages 701 and 703 in a non-sequential page order, which can include a random order.

Alternatively, memory device 200 can store information in pages 701, 702, 703, and 704 in a sequential page order. For example, memory device 200 may store information in a sequential page order of page 701, 702, 703, and 704. In another example, memory device 700 may store information in a sequential page order of page 704, 703, 702, and 701.

Figure 8:
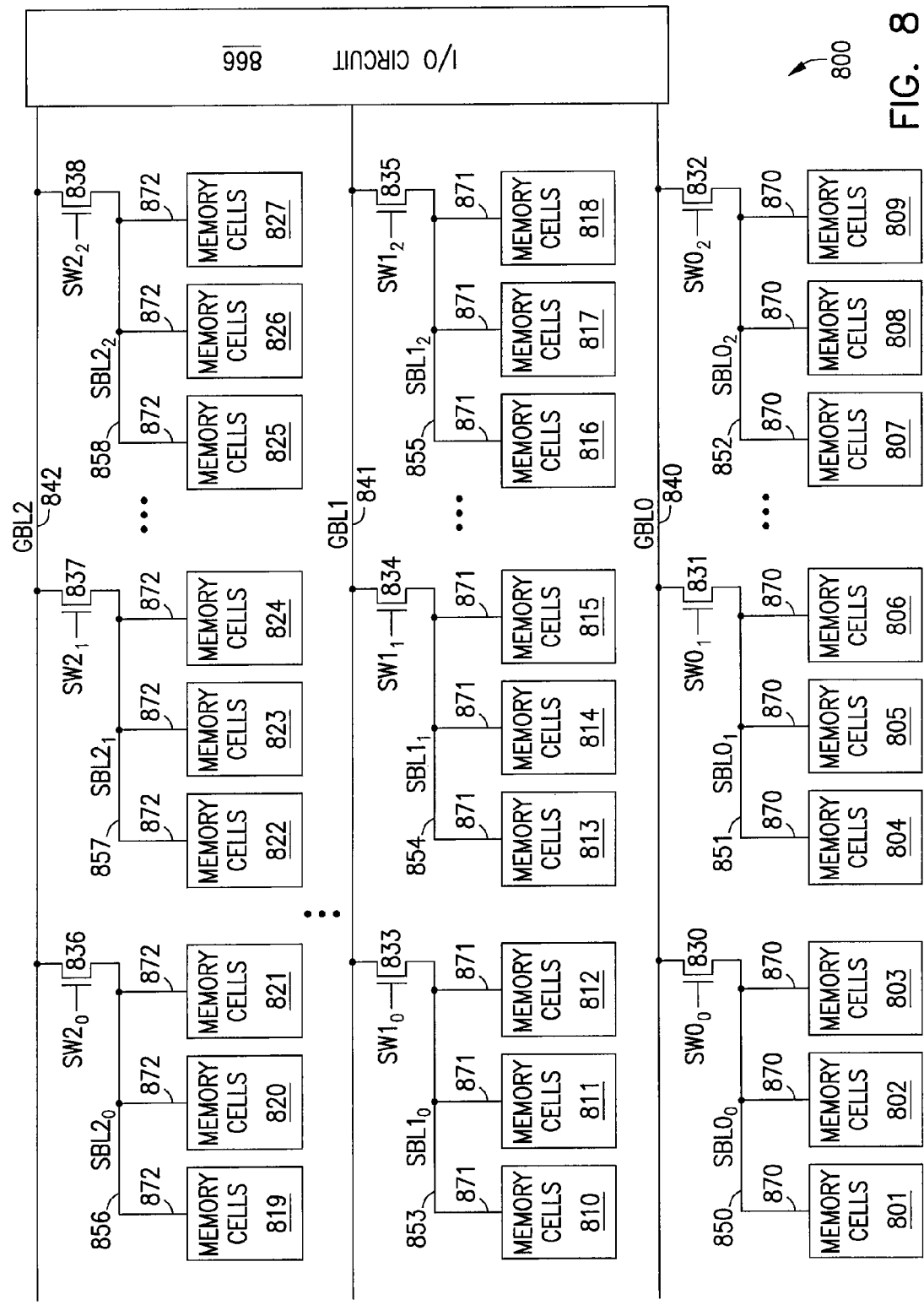
FIG. 8 shows a partial block diagram of a memory device including global data lines, according to an embodiment of the invention.

FIG. 8 shows a partial block diagram of a memory device 800 including global data lines 840, 841, and 842, according to an embodiment of the invention. Memory device 800 can be associated with memory device 100 of FIG. 1, such as forming a portion of memory array 102 of memory device 100. Memory device 800 includes device portions 801 through 827, each including memory cells. Memory device 800 can include a planar memory device where the memory cells can be arranged in only a single device level. Memory device 800 can also include a 3-D memory device where the memory cells can be arranged in multiple device levels, such that one memory cell can be stacked over one or more other memory cell over a substrate (e.g., a semiconductor substrate).

Memory device 800 can also include lines 840, 841, and 842 to transfer information (e.g., in the form of signals GBL0, GBL1, and GBL2) between the memory cells in device portions 801 through 827 and an I/O circuit 866. Lines 840, 841, and 842 can be part of global data lines of memory device 800. Memory device 800 can also include lines 850 through 858 which can be part of sub-data lines. Lines 850, 851, and 852 can carry signals $SBL0_0$, $SBL0_1$, and $SBL0_2$. Lines 853, 854, and 855 can carry signals $SBL1_0$, $SBL1_1$, and $SBL1_2$. Lines 856, 857, and 858 can carry signals $SBL2_0$, $SBL2_1$, and $SBL2_2$.

The memory cells in each of device portions 801 through 827 are associated with lines 870, 871, and 872, which can be part of local data lines. Each of lines 870 can correspond to line 270 of FIG. 2 and FIG. 5. Each of lines 871 can correspond to line 271 of FIG. 2. Each of lines 872 can correspond to line 272 of FIG. 2.

The memory cells in device portions 801 through 809 can couple to each of lines 870 similarly to memory cells 210 coupled to line 270 in FIG. 2 and FIG. 5. Each of device portions 801 through 809 can also include transistors similar to transistors 251, 253, 255, 281, and 284, and their associated connections in FIG. 2 and FIG. 5.

The memory cells in device portions 810 through 818 can couple to each of lines 871 similarly to memory cells 211 coupled to line 271 in FIG. 2 and FIG. 5. Each of device portions 810 through 818 can also include transistors and their associated connections similar to transistors 251, 253, 255, 281, and 284, and their associated connections in FIG. 2 and FIG. 5.

The memory cells in device portions 819 through 827 can couple to each of lines 872 similarly to memory cells 212 coupled to line 272 in FIG. 2 and FIG. 5. Each of device portions 819 through 827 can also include transistors and their associated connections similar to transistors 251, 253, 255, 281, and 284, and their associated connections in FIG. 2 and FIG. 5.

As shown in FIG. 8, lines 870 are coupled to lines 850, 851, and 852, which in turn are coupled to line 840 through switches 830, 831, and 832, respectively. Each of switches 830, 831, and 832 can include a transistor, which can be directly connected between line 840 and one of lines 850, 851, and 852. Each of switches 830, 831, and 832 can be controlled by one of signals $SW0_0$, $SW0_1$, and $SW0_2$, respectively. For example, switches 830, 831, and 832 can turn on to couple lines 850, 851, and 852, respectively, to line 840. Switches 830, 831, and 832 can turn off to decouple lines 850, 851, and 852, respectively, from line 840.

In a memory operation (e.g., read operation), if at least one of the memory cells in device portions 801, 802, and 803 is a selected memory cell, switch 830 can turn on to couple line 850 to line 840. If none of the memory cells in device portions 801, 802, and 803 are selected memory cells, switch 830 can turn off to decouple line 850 from line 840.

Similarly, in a memory operation (e.g., read operation), if at least one of the memory cells in device portions 804, 805, and 806 is a selected memory cell, switch 831 can turn on to couple line 851 to line 840. If none of the memory cells in device portions 804, 805, and 806 are selected memory cells, switch 831 can turn off to decouple line 851 from 840.

If at least one of the memory cells in device portions 807, 808, and 809 is a selected memory cell in a memory operation (e.g., read operation), switch 832 can turn on to couple line 852 to line 840. If none of the memory cells in device portions 807, 808, and 809 are selected memory cells, switch 832 can turn off to decouple line 852 to from 840. Decoupling line 850, 851, or 852 from line 840 in the manner described herein may reduce coupling capacitance between line 840 and lines 850, 851, or 852.

As shown in FIG. 8, memory device 800 can also include switches 833, 834, and 835 coupled between line 841 and lines 853, 854, and 855, respectively. Memory device 800 may use signals $SW1_0$, $SW1_1$, and $SW1_2$ to decouple lines 853, 854, and 855 from line 841, respectively, in a similar manner described above with respect to switches 830, 831, and 832.

Memory device 800 can also include switches 836, 837, and 838 coupled between line 842 and lines 856, 857, and 858, respectively. Memory device 800 may use signals $SW2_0$, $SW2_1$, and $SW2_2$ to decouple lines 856, 857, and 858 from line 841, respectively, in a similar manner described above with respect to switches 830, 831, and 832.

FIG. 8 shows memory device 800 having an example of three global data lines (e.g. 840, 841, and 842) and three device portions with memory cells coupled to each sub-data line (e.g., line 855). The number of global data lines, sub-data lines, local data lines and device portions coupled to a sub-data line can vary.

The illustrations of apparatus (e.g., memory devices 100, 200, and 800) are intended to provide a general understanding of the structure of various embodiments and are not intended to provide a complete description of all the elements and features of apparatus and systems that might make use of the structures described herein.

Any of the components described above with reference to FIG. 1 through FIG. 8 can be implemented in a number of ways, including simulation via software. Thus, apparatus (e.g., memory devices 100, 200, and 800) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory devices 100, 200, and 800) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, message information switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatus and methods having a memory device. Such a memory device can include a line to exchange information with a memory cell and a transistor coupled between the memory cell and the line. Such a memory device can also include a module configured to couple a gate of the transistor to a node during a first time interval of a memory operation and decouple the gate from the node during a second time interval of the memory operation. In one example, such a module can include a transistor or transistors, such as transistors 253, 255 and/or 284, for example. Other embodiments including additional apparatus and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A memory device comprising:
a string of first memory cells, the first memory cells located on different levels of the memory device;
a string of second memory cells, the second memory cells located on the different levels of the memory device;
a data line associated with the string of first memory cells and the string of second memory cells; and
a module configured to couple a gate of a transistor to at least one of a reference potential and a positive voltage and selectively couple the string of first memory cells to the data line through the transistor if at least one memory cell in the string of first memory cells is selected to be accessed during a memory operation, and not couple the gate of the transistor to the reference potential and the positive voltage if no memory cell in the string of first memory cells is selected to be accessed during the memory operation and if at least one memory cell in the string of second memory cells is selected to be accessed during the memory operation.

2. The memory device of claim 1, wherein the module is configured to couple a gate of an additional transistor to at least one of the reference potential and the positive voltage and selectively couple the string of second memory cells to the data line through the additional transistor if at least one memory cell in the string of second memory cells is selected to be accessed during the memory operation, and not couple the gate of the additional transistor to the reference potential and the positive voltage if no memory cell in the string of second memory cells is selected to be accessed during the memory operation and if at least one memory cell in the string of first memory cells is selected to be accessed during the memory operation.

3. The memory device of claim 1, wherein the reference potential includes ground potential.

4. The memory device of claim 1, wherein the data line includes a bit line of the memory device.

5. The memory device of claim 1, wherein the memory operation includes a read operation and the module is configured to couple the data line to at least one of the reference potential and the positive voltage during the first time interval of the read operation.

6. The memory device of claim 5, wherein the module is configured not to couple the gate of the transistor to the reference potential and the positive voltage during the second time interval of the read operation.

7. The memory device of claim 6, further comprising:
an additional transistor coupled between the string of first memory cell and a source line, wherein the module is configured to couple a gate of the additional transistor to the reference potential during the first time interval and to decouple the gate of the additional transistor from the reference potential during the second time interval.

8. A memory device comprising:
a string of memory cells, the memory cells located on different levels of the memory device;
a data line; and
a transistor including a gate configured to be coupled to at least one of a first potential and a second potential during a memory operation if a memory cell of the string of the memory cells is selected to provide information stored in the memory cell to the data line, and the gate configured to be decoupled from the first potential and the second potential if no memory cell in the string of memory cells is selected to provide information stored in a memory cell in the string of memory cells to the data line during the memory operation and if at least one additional memory cell in an additional string of memory cells is selected to provide information stored in the additional memory cell to the data line during the memory operation.

9. The memory device of claim 8, further comprising:
a first additional transistor configured to turn on and couple the gate to the first potential; and
a second additional transistor configured to turn on and couple the gate to the second potential, wherein the first and second additional transistors are configured to turn off if no memory cell in the string of memory cells is selected to provide information stored in the memory cell in the string of memory cells to the data line during the memory operation and if at least one additional memory cell in the additional string of memory cells is selected to provide information stored in the additional memory cell to the data line during the memory operation.

10. The memory device of claim 8, wherein the memory operation includes an operation to sense information stored in the selected memory cell.

11. The memory device of claim 8, wherein the first potential includes ground potential.

12. The memory device of claim 11, wherein the second potential includes a voltage having a positive value.

13. The memory device of claim 8, wherein the data line includes a bit line of the memory device.

14. The memory device of claim 13, wherein the transistor is configured to be coupled to at least one of the first potential and the second potential during a pre-charge time interval of the memory operation.

15. A memory device comprising:
- a first block of memory cells and a second block of memory cells, the memory cells are cells located on different levels of the memory device;
- a line to exchange information with the first and second blocks of memory cells;
- a first transistor coupled between the line and the first block of memory cells;
- a second transistor coupled between the line and the second block of memory cells; and
- a module configured to access at least one memory cell of the first block of memory cells in a memory operation and to access no memory cells of the second block of memory cells in the memory operation, the module configured to couple a gate of the first transistor and a gate of the second transistor to a reference potential during a first time interval of the memory operation, and to couple the gate of the first transistor to a first voltage during a second time interval of the memory operation, and the module configured to decouple the gate of the second transistor from the reference potential during the second time interval of the memory operation.

16. The memory device of claim 15, wherein the module is configured to access at least one memory of the second block of memory cells in an additional memory operation and to access none of the memory cells of the first block of memory cells in the additional memory operation, the module configured to couple the gate of the first transistor and the gate of the second transistor to the reference potential during a first time interval of the additional memory operation, and to couple the gate of the second transistor to a second voltage during a second time interval of the additional memory operation, and the module configured to decouple the gate of the first transistor from the reference potential during the second time interval of the additional memory operation.

17. The memory device of claim 15, further comprising a substrate, wherein the first block of memory cell includes a first memory cell overlying the substrate and a second memory cell overlying the first memory cell.

18. The memory device of claim 15, wherein the first and second blocks of memory cells are organized into pages, and the module is configured to store information in the pages in a non-sequential page order.

19. The memory device of claim 18, wherein at least one of the pages includes memory cells arranged in a same row.

20. The memory device of claim 18, wherein the non-sequential page order includes a random order.

21. A method comprising:
- coupling a gate of a transistor to a first node during a first time interval of a memory operation of a device such that a string of memory cells is decoupled from a data line during the first time interval if at least one memory cell of the string of the memory cells is selected to be accessed during the memory operation, the memory cells located on different levels of the device;
- coupling the gate of the transistor to a second node during a second time interval of the memory operation such that the string of memory cells is coupled to the data line through the transistor during the second time interval if at least one memory cell of string of the memory cells is selected to be accessed during the memory operation; and
- decoupling the gate of the transistor from the first and second nodes if no memory cell in the string of memory cells is selected to be accessed during the memory operation and if at least one memory cell of an additional string of memory cells associated with the data line is selected to be accessed.

22. The method of claim 21, wherein the memory operation includes a read operation.

23. The method of claim 21, wherein the first time interval includes a precharge time interval.

24. The method of claim 21, wherein the second time interval includes a sensing time interval.

* * * * *